(12) United States Patent
Mishima et al.

(10) Patent No.: US 7,422,800 B2
(45) Date of Patent: Sep. 9, 2008

(54) LIGHT EMITTING DEVICE

(75) Inventors: Masayuki Mishima, Minami-Ashigara (JP); Jun Ogasawara, Minami-Ashigara (JP)

(73) Assignee: Fujifilm Corporation, Tokyo (JP)

( * ) Notice: Subject to any disclaimer, the term of this patent is extended or adjusted under 35 U.S.C. 154(b) by 357 days.

(21) Appl. No.: 11/066,195

(22) Filed: Feb. 25, 2005

(65) Prior Publication Data

US 2005/0202278 A1 Sep. 15, 2005

(30) Foreign Application Priority Data

Mar. 10, 2004 (JP) .......................... P.2004-066781
Jan. 28, 2005 (JP) .......................... P.2005-021268

(51) Int. Cl.
*C09K 11/06* (2006.01)
*H01L 51/54* (2006.01)

(52) U.S. Cl. ....................... 428/690; 428/917; 313/504; 313/506; 257/40; 257/E51.024

(58) Field of Classification Search ....................... None
See application file for complete search history.

(56) References Cited

U.S. PATENT DOCUMENTS

| 6,303,238 | B1 | 10/2001 | Thompson et al. | |
|---|---|---|---|---|
| 6,444,333 | B1* | 9/2002 | Okada et al. | 428/690 |
| 2002/0071964 | A1* | 6/2002 | Oh et al. | 428/690 |
| 2002/0102433 | A1* | 8/2002 | Lee et al. | 428/690 |
| 2003/0039858 | A1* | 2/2003 | Igarashi et al. | 428/690 |
| 2003/0168970 | A1* | 9/2003 | Tominaga et al. | 313/504 |
| 2003/0198831 | A1* | 10/2003 | Oshiyama et al. | 428/690 |

FOREIGN PATENT DOCUMENTS

| JP | 2001-196178 A | | 7/2001 |
|---|---|---|---|
| JP | 2002-180040 A | | 6/2002 |
| WO | WO 02/43449 | * | 5/2002 |

OTHER PUBLICATIONS

M.A. Baldo et al., Applied Physisc Letter, 1999, vol. 75 p. 4 to 6.
Tetsuo Tsutsui et al., Japanese Journal of Applied Physics, 1999, vol. 38, p. L1502 to L1504.
Shizuo Tokito et al., Applied Physics Letter, 2003, vol. 83 pp. 569 to 571.

* cited by examiner

*Primary Examiner*—Marie R. Yamnitzky
*Assistant Examiner*—Brett A Crouse
(74) *Attorney, Agent, or Firm*—Birch, Stewart, Kolasch & Birch, LLP

(57) ABSTRACT

To provide an organic electroluminescent device having excellent durability and having high luminous efficiency and luminance, the organic electroluminescent device includes an organic compound layer containing at least one light emitting layer, wherein the light emitting layer contains a light emitting material and an electrically inactive organic compound capable of being subjected to dry film formation and having an energy difference Eg between highest occupied molecular orbital and lowest unoccupied molecular orbital of 4.0 eV or more.

8 Claims, No Drawings

LIGHT EMITTING DEVICE

FIELD OF THE INVENTION

The present invention relates to a light emitting device having extremely excellent durability and having extremely high luminance and luminous efficiency, and in particular, to a light emitting device suitable as an organic electroluminescent device.

BACKGROUND OF THE INVENTION

Organic electroluminescent devices using an organic substance are promising in applications as a cheap large-area full-color display device having a solid light-emitting solid-state device and a light source array for writing, and a number of developments have been carried out. In general, an organic electroluminescent device is constructed of a light emitting layer and a pair of counter electrodes disposed sandwiching the light emitting layer therebetween. When an electric field is applied between the both electrodes, an electron is injected from the cathode, and a hole is injected from the anode. The light emission is a phenomenon in which the electron and the hole are re-coupled in the light emitting layer, and energy is released as light during a time when the energy level is returned to a valence band from a conductor.

However, in the case of such an organic electroluminescent device, there is a serious problem that the luminous efficiency is very low as compared with inorganic LED devices and fluorescent tubes.

Almost all of organic electroluminescent devices which are currently proposed are ones utilizing fluorescent light emission obtained by a singlet exciton of an organic light emitting material. In a simple mechanism of the quantum chemistry, in the exciton state, a ratio of the singlet exciton from which fluorescent light emission is obtainable to the triplet exciton from which phosphorescent light emission is obtainable is 1/3. So far as the fluorescent light emission is utilized, only 25% of the exciton can be effectively applied so that the luminous efficiency is low.

On the other hand, if phosphorescence obtainable from the triplet exciton can be utilized, the luminous efficiency should be able to be enhanced. Actually, in recent years, organic electroluminescent devices utilizing phosphorescence with a phenylpyridine complex of iridium have been reported, and it is reported that such organic electroluminescent devices exhibit the luminous efficiency of 2 to 3 times as compared with the conventional organic electroluminescent devices utilizing fluorescence (for example, see U.S. Pat. No. 6,303,238, *Applied Physics Letter*, 1999, Vol. 75, page 4, and *Japanese Journal of Applied Physics*, 1999, Vol. 38, pages L1502 to L1504).

Most of phosphorescence organic electroluminescent devices have a device construction of anode/hole transport layer/light emitting layer/block layer/electron transport layer/cathode. In the light emitting layer, a host material having a function to undergo energy transfer of triplet exciton energy into a light emitting material and a phosphorescent material are mainly used. In general, carbazole compounds such as CBP (4,4'-N,N"-di-carbazolebiphenyl) are frequently used as the host material.

In order to efficiently transfer triplet exciton energy from the host material into the phosphorescent material, it is necessary that a lowest energy level T1 of the triplet excited state of the host material is larger than that of the light emitting material. In a green light emitting material or a red light emitting material, even if CBP is used as the host material, since the T1 of CBP becomes sufficiently larger than that of the light emitting material, a high luminous efficiency is obtained.

However, in the case of a blue light emitting material, since the T1 of the light emitting material becomes larger than that of CBP as the host material, it becomes difficult to efficiently transfer the triplet exciton energy, resulting in a serious problem that the luminous efficiency is largely lowered.

As a host material having a large T1, which is useful as the blue light emitting material, there is reported CDBP (4,4'-bis (9-carbazolyl)-2,2'-dimethyl-biphenyl) resulting from incorporation of a methyl group into the biphenyl of CBP (for example, see *Applied Physics Letter*, 2003, Vol. 83, page 569). However, its luminous efficiency is still low, and its durability is also problematic.

On the other hand, in the light emitting layer, it is possible to undergo light emission only with a light emitting material without containing a host material. However, quenching is generated due to a mutual action among the light emitting materials, resulting in a problem that both luminance and luminous efficiency become low.

For the purpose of solving this problem, there is proposed a method in which an electrically inactive inorganic dielectric material and a light emitting material are made co-present in the light emitting layer (for example, see JP-A-2001-196178). However, in order to subject the inorganic dielectric material and an organic material which is the light emitting material to film formation jointly, thereby forming the light emitting layer, the light emitting material which can be used is restricted.

Also, there is disclosed a method in which an electrically inactive polymer binder is used in the light emitting layer (for example, see JP-A-2002-180040). However, since the polymer is used, the production process of an organic electroluminescent device is limited to a wet film formation process (see JP-A-2002-180040).

SUMMARY OF THE INVENTION

In the organic electroluminescent device, high luminous efficiency and luminance are required. However, as described previously, in an organic electroluminescent device utilizing phosphorescent light emission, it is a present state that a device having high luminous efficiency and luminance in all of blue light emission, green light emission and red light emission and having excellent durability is eagerly demanded.

In view of these circumstances, an object of the invention is to provide an organic electroluminescent device having excellent durability and having high luminous efficiency and luminance.

According to the invention, the following organic electroluminescent devices are provided, whereby the foregoing object of the invention is achieved.

<1> An organic electroluminescent device comprising:
a pair of electrodes;
an organic compound layer between the pair of electrode, the organic compound layer comprising a light emitting layer,
wherein the light emitting layer comprises:
a light emitting material; and
an electrically inactive organic compound capable of being subjected to dry film formation, the electrically inactive organic compound having an energy difference Eg between a highest occupied molecular orbital and a lowest unoccupied molecular orbital of 4.0 eV or more.

<2> The organic electroluminescent device as set forth above in <1>, wherein the light emitting material comprises a phosphorescent material.

<3> The organic electroluminescent device as set forth above in <2>, wherein the phosphorescent material is an orthometalated metal complex or a porphyrin metal complex.

<4> The organic electroluminescent device as set forth above in any one of <1> to <3>, wherein the electrically inactive organic compound has a triplet excited state having a lowest energy level T1 of 2.7 eV or more.

<5> The organic electroluminescent device as set forth above in any one of <1> to <4>, wherein the electrically inactive organic compound has an ionization potential Ip of 6.1 eV or more.

<6> The organic electroluminescent device as set forth above in any one of <1> to <5>, wherein the electrically inactive organic compound is an aromatic hydrocarbon compound.

<7> The organic electroluminescent device as set forth above in any one of <1> to <6>, wherein the electrically inactive organic compound is a compound represented by formula (1):

  Formula (1)

wherein Ar represents a group represented by formula (2); L represents a trivalent or polyvalent benzene skeleton; and m represents an integer of 3 or more:

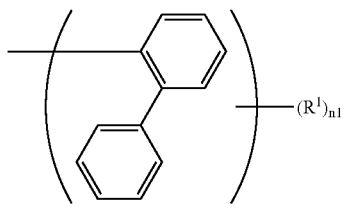

Formula (2)

wherein $R^1$ represents a substituent; when plural $R^1$s are present, the plural $R^1$s are the same or different; and n1 represents an integer of from 0 to 9.

<8> The organic electroluminescent device as set forth above in any one of <1> to <6>, wherein the electrically inactive organic compound is a compound represented by formula (3):

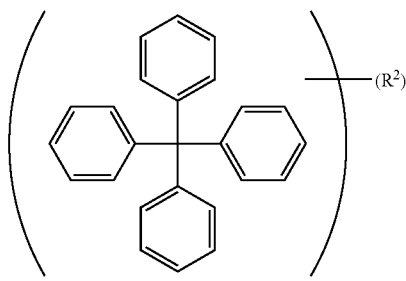

Formula (3)

wherein $R^2$ represents a substituent; when plural $R^2$s are present, the plural $R^2$s are same or different; and n2 represents an integer of from 0 to 20.

<9> The organic electroluminescent device as set forth above in any one of <1> to <8>, wherein the electrically inactive organic compound has a molecular weigh of from 300 to 2,000.

According to the foregoing construction, the organic electroluminescent device of the invention uses a light emitting material and an electrically inactive organic compound having an energy difference Eg between a highest occupied molecular orbital and a lowest unoccupied molecular orbital of 4.0 eV or more in the light emitting layer, whereby it is possible to undergo light emission with high luminance and high efficiency without using a host material. As a result, the organic electroluminescent device of the invention is high in luminance and luminous efficiency and excellent in durability.

The organic electroluminescent device of the invention can be effectively utilized for area light sources such as full color displays and backlights and light source arrays such as printers.

DETAILED DESCRIPTION OF THE INVENTION

The organic electroluminescent device of the invention is an organic electroluminescent device comprising an organic compound layer containing at least one light emitting layer, wherein the light emitting layer contains a light emitting material and an electrically inactive organic compound capable of being subjected to dry film formation and having an energy difference Eg between highest a occupied molecular orbital and a lowest unoccupied molecular orbital of 4.0 eV or more.

In this way, by using a light emitting material and an electrically inactive organic compound having an energy difference Eg between a highest occupied molecular orbital and a lowest unoccupied molecular orbital of 4.0 eV or more in the light emitting layer, even when a host material is not contained in the light emitting layer, it becomes possible to directly form an exciton in the light emitting material. Also, since the light emitting material is subjected to molecular dispersion in the foregoing electrically inactive organic compound, neither a mutual action among light emitting materials nor quenching is caused. As a result, not only it is possible to undergo phosphorescent light emission with high efficiency without using a host material, but also it is possible to obtain an organic electroluminescent device having very high luminous efficiency.

In the invention, the electrically inactive organic compound acts as a good binder material capable of being subjected to dry film formation within the light emitting layer.

Since this organic compound has an energy difference Eg between a highest occupied molecular orbital and a lowest unoccupied molecular orbital of 4.0 eV or more, that is, it is electrically inactive, it is possible to increase a dilution effect of the light emitting material, whereby the luminous efficiency and durability are improved.

The material capable of being subjected to dry film formation, as referred to herein, means a material which can be subjected to film formation without causing decomposition by a dry film formation process such as a vapor deposition process, and its molecular weight is from 300 to 2,000.

In the invention, it is preferred from the standpoint of luminous efficiency to use a phosphorescent material in the light emitting layer.

Also, it is preferable that the electrically inactive organic compound has a triplet excited state having a lowest energy level T1 of 2.7 eV or more. In this way, the diffusion of an exciton from the light emitting material of the light emitting layer is blocked, whereby the luminous efficiency can be more enhanced, and therefore, such is preferable. In the case where the light emitting material is a phosphorescent material emitting blue light, its T1 is around 2.6 eV, and for the purpose of blocking diffusion of a triplet exciton therefrom, it is preferable that the T1 of the electrically inactive organic compound is at least the foregoing value, that is, 2.7 eV or more. In this way, with respect to the phosphorescent material emitting blue light, it is also possible to more enhance the luminous efficiency.

Further, in the invention, it is preferable that the electrically inactive organic compound has an ionization potential Ip of 6.1 eV or more. In this way, the transfer of the hole from the light emitting material into the subject electrically inactive organic compound is blocked, and the hole remains in the light emitting material, whereby a probability of the formation of an exciton can be enhanced. As a result, the luminous efficiency can be more enhanced, and therefore, such is preferable. Further, the Ip is more preferably 6.2 eV or more, and especially preferably 6.3 eV or more. In particular, in the case where the light emitting material is a phosphorescent material emitting blue light, its ionization potential is from 5.8 to 5.9 eV. In order that the hole may not be transferred from this phosphorescent material emitting blue light into the electrically inactive organic compound, it is preferable that the ionization potential of the electrically inactive organic compound is larger than that value, i.e., 6.0 eV or more. In this way, in an organic electroluminescent device emitting blue phosphorescent light, the luminous efficiency can be more enhanced, too.

In the invention, the electrically inactive organic compound is not particularly limited so far as it meets the foregoing conditions. From the viewpoint of stability, an aromatic hydrocarbon is preferable, and a compound represented by formula (1) or formula (3) is more preferable.

$$L\text{-}(Ar)_m \qquad \text{Formula (1)}$$

In the formula (1), Ar represents a group represented by formula (2); L represents a trivalent or polyvalent benzene skeleton; and m represents an integer of 3 or more.

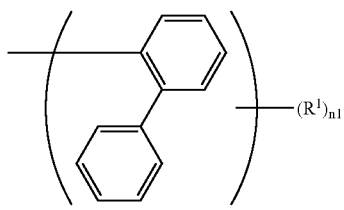

Formula (2)

In the formula (2), $R^1$ represents a substituent; when plural $R^1$s are present, they may be the same or different; and n1 represents an integer of from 0 to 9.

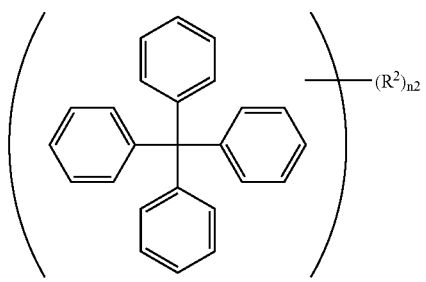

Formula (3)

In the formula (3), $R^2$ represents a substituent; when plural $R^2$s are present, they may be the same or different; and n2 represents an integer of from 0 to 20.

The formula (1) will be described below in detail.

L in the formula (1) represents a trivalent or polyvalent benzene skeleton. Ar represents a group represented by the formula (2); and m represents an integer of 3 or more. m is preferably from 3 to 6, and more preferably 3 or 4.

Next, the group represented by the formula (2) will be described below.

$R^1$ in the formula (2) represents a substituent. Examples of the substituent include an alkyl group (preferably having from 1 to 30 carbon atoms, more preferably from 1 to 20 carbon atoms, and especially preferably from 1 to 10; for example, methyl, ethyl, isopropyl, tert-butyl, n-octyl, n-decyl, n-hexadecyl, cyclopropyl, cyclopentyl, and cyclohexyl), an alkenyl group (preferably having from 2 to 30 carbon atoms, more preferably from 2 to 20 carbon atoms, and especially preferably from 2 to 10 carbon atoms; for example, vinyl, allyl, 2-butenyl, and 3-pentenyl), an alkynyl group (preferably having from 2 to 30 carbon atoms, more preferably from 2 to 20 carbon atoms, and especially preferably from 2 to 10 carbon atoms; for example, propargyl and 3-pentynyl), an aryl group (preferably having from 6 to 30 carbon atoms, more preferably from 6 to 20 carbon atoms, and especially preferably from 6 to 12 carbon atoms; for example, phenyl, p-methylphenyl, naphthyl, and anthranyl), an amino group (preferably having from 0 to 30 carbon atoms, more preferably from 0 to 20 carbon atoms, and especially preferably from 0 to 10 carbon atoms; for example, amino, methylamino, dimethylamino, diethylamino, dibenzylamino, diphenylamino, and ditolylamino), an alkoxy group (preferably having from 1 to 30 carbon atoms, more preferably from 1 to 20 carbon atoms, and especially preferably from 1 to 10 carbon atoms; for example, methoxy, ethoxy, butoxy, and 2-ethylhexyloxy), an aryloxy group (preferably having from 6 to 30 carbon atoms, more preferably from 6 to 20 carbon atoms, and especially preferably from 6 to 12 carbon atoms; for example, phenyloxy, 1-naphthyloxy, and 2-naphthyloxy), a heteroaryloxy group (preferably having from 1 to 30 carbon atoms, more preferably from 1 to 20 carbon atoms, and especially preferably from 1 to 12 carbon atoms; for example, pyridyloxy, pyrazyloxy, pyrimidyloxy, and quinolyloxy), an acyl group (preferably having from 1 to 30 carbon atoms, more preferably from 1 to 20 carbon atoms, and especially preferably from 1 to 12 carbon atoms; for example, acetyl, benzoyl, formyl, and pivaloyl), an alkoxycarbonyl group (preferably having from 2 to 30 carbon atoms, more preferably from 2 to 20 carbon atoms, and especially preferably from 2 to 12 carbon atoms; for example, methoxycarbonyl and ethoxycarbonyl), an aryloxycarbonyl group (preferably having from 7 to 30 carbon atoms, more preferably from 7 to 20 carbon atoms, and especially preferably from 7 to 12 carbon atoms; for example, phenyloxycarbonyl), an acyloxy group (preferably having from 2 to 30 carbon atoms, more preferably from 2 to 20 carbon atoms, and especially preferably from 2 to 10 carbon atoms; for example, acetoxy and benzoyloxy), an acylamino group (preferably having from 2 to 30 carbon atoms, more preferably from 2 to 20 carbon atoms, and especially preferably from 2 to 10 carbon atoms; for example, acetylamino and benzoylamino), an alkoxycarbonylamino group (preferably having from 2 to 30 carbon atoms, more preferably from 2 to 20 carbon atoms, and especially preferably from 2 to 12 carbon atoms; for example, methoxycarbonylamino), an aryloxycarbonylamino group (preferably having from 7 to 30 carbon atoms, more preferably from 7 to 20 carbon atoms, and especially preferably from 7 to 12 carbon atoms; for example, phenyloxycarbonylamino), a sulfonylamino group (preferably having from 1 to 30 carbon atoms, more preferably from 1 to 20 carbon atoms, and especially preferably from 1 to 12 carbon atoms; for example, methanesulfonylamino and benzenesulfonylamino), a sulfamoyl group (preferably having from 0 to 30 carbon atoms, more preferably from 0 to 20 carbon atoms, and especially preferably from 0 to 12 carbon atoms; for example, sulfamoyl, methylsulfamoyl, dimethylsulfamoyl, and phenylsulfamoyl), a carbamoyl group (preferably having from 1 to 30 carbon atoms, more preferably from 1 to 20 carbon atoms, and especially preferably from 1 to 12 carbon atoms; for example, carbamoyl, methylcarbamoyl, diethylcarbamoyl, and phenylcarbamoyl), an alkylthio group (preferably having from 1 to 30 carbon atoms, more preferably from 1 to 20 carbon atoms, and especially preferably from 1 to 12 carbon atoms; for example, methylthio and ethylthio); an arylthio group (preferably having from 6 to 30 carbon atoms, more preferably from 6 to 20 carbon atoms, and especially preferably from 6 to 12 carbon atoms; for example, phenylthio), a heteroarylthio group (preferably having from 1 to 30 carbon atoms, more preferably from 1 to 20 carbon atoms, and especially preferably from 1 to 12 carbon atoms; for example, pyridylthio, 2-benzimidazolylthio, 2-benzoxazolylthio, and 2-benzthiazolylthio), a sulfonyl group (preferably having from 1 to 30 carbon atoms, more preferably from 1 to 20 carbon atoms, and especially preferably from 1 to 12 carbon atoms; for example, mesyl and tosyl), a sulfinyl group (preferably having from 1 to 30 carbon atoms, more preferably from 1 to 20 carbon atoms, and especially preferably from 1 to 12 carbon atoms; for example, methanesulfinyl and benzenesulfinyl), an ureido group (preferably having from 1 to 30 carbon atoms, more preferably from 1 to 20 carbon atoms, and especially preferably from 1 to 12 carbon atoms; for example, ureido, methylureido, and phenylureido), a phosphoric amide group (preferably having from 1 to 30 carbon atoms, more preferably from 1 to 20 carbon atoms, and especially preferably from 1 to 12 carbon atoms; for example, diethylphosphoric amide and phenylphosphoric amide), a hydroxyl group, a mercapto group, a halogen atom (for example, a fluorine atom, a chlorine atom, a bromine atom, and an iodine atom), a cyano group, a sulfo group, a carboxyl group, a nitro group, a hydroxamic acid group, a sulfino group, a hydrazino group, an imino group, a heterocyclic group (preferably having from 1 to 30 carbon atoms, and more preferably from 1 to 12 carbon atoms; examples of the hetero atom include a nitrogen atom, an oxygen atom, and a sulfur atom; and specific examples thereof imidazolyl, pyridyl, quinolyl, furyl, thienyl, piperidyl, morpholino, benzoxazolyl, benzimidazolyl, and benzthiazolyl), and a silyl group (preferably having from 3 to 40 carbon atoms, more preferably from 3 to 30 carbon atoms, and especially preferably from 3 to 24 carbon atoms; for example, trimethylsilyl and triphenylsilyl).

When plural $R^1$s are present, they may be the same or different and may be taken together to form a ring. Also, $R^1$ may further be substituted.

n1 represents an integer of from 0 to 9. n1 is preferably an integer of from 0 to 6, and more preferably from 0 to 3.

Subsequently, the formula (3) will be described below.

In the formula (3), $R^2$ represents a substituent. The substituent $R^2$ is synonymous with the foregoing substituent $R^1$ including the preferred embodiment thereof.

n2 represents an integer of from 0 to 20. n2 is preferably in the range of from 0 to 10, and more preferably from 0 to 5.

Compound examples of the formula (1) or formula (3) will be given below, but it should not be construed that the invention is limited thereto.

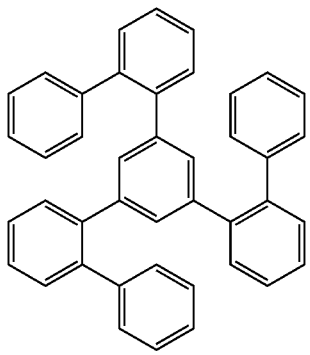

(1)

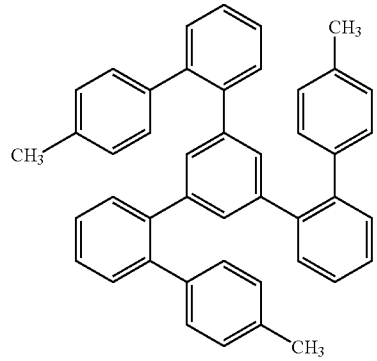

(2)

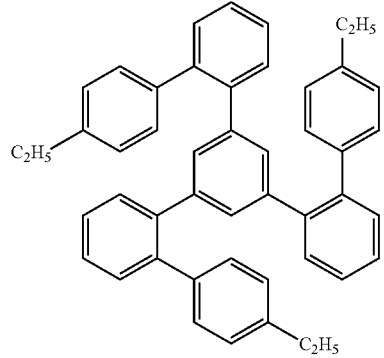

(3)

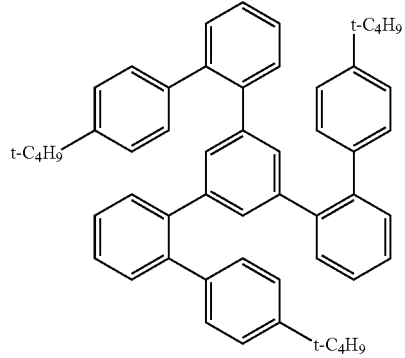

(4)

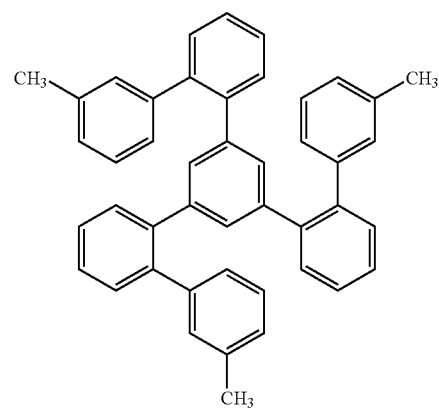

(5)

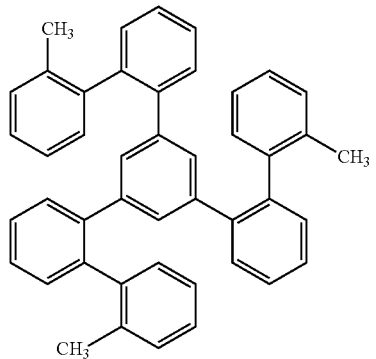
(6)
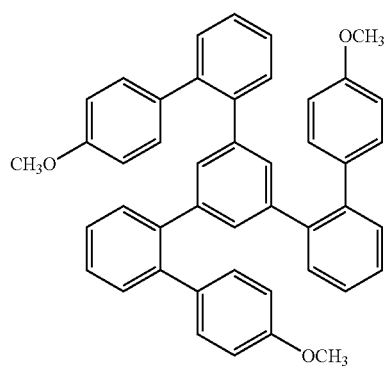
(7)
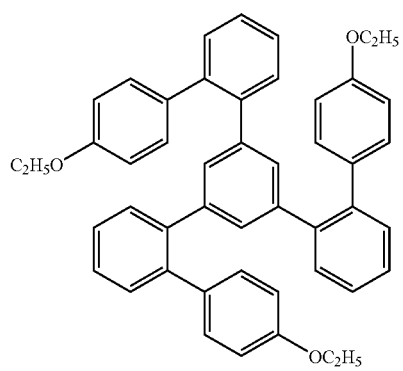
(8)
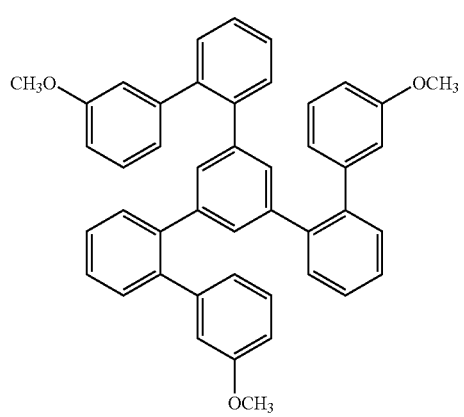
(9)
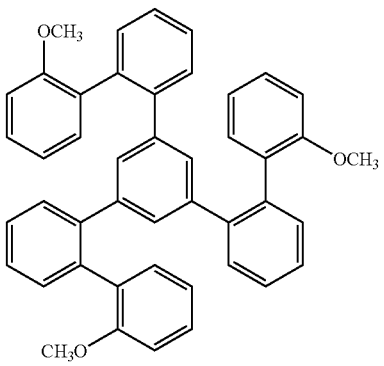
(10)
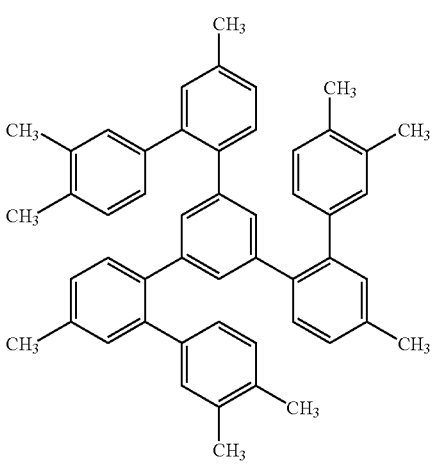
(11)
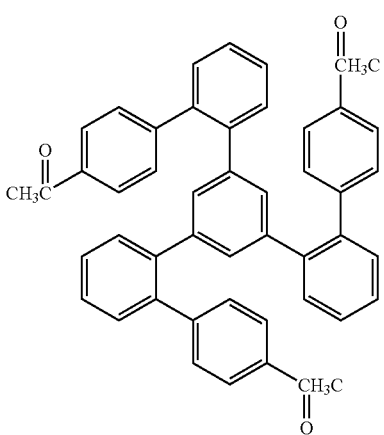
(12)

-continued
(13)
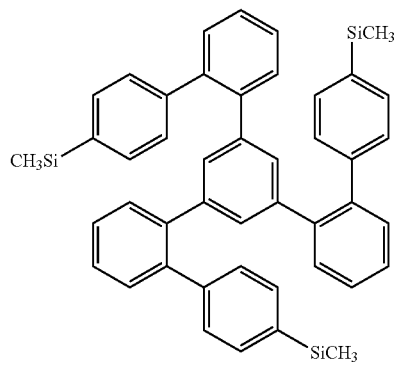
(14)
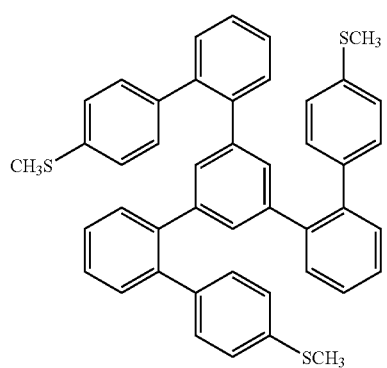
(15)
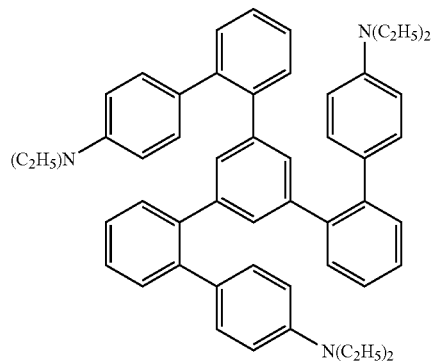
(16)
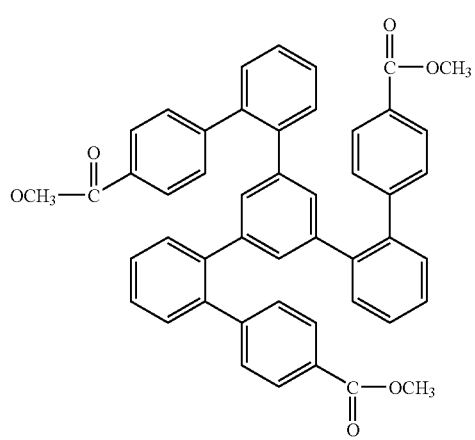
-continued
(17)
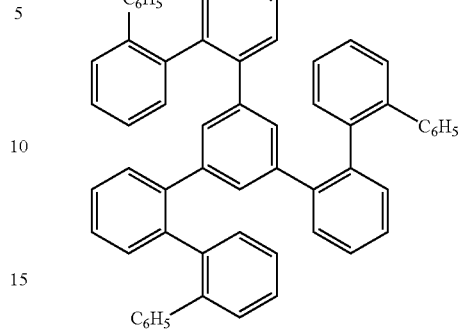
(18)
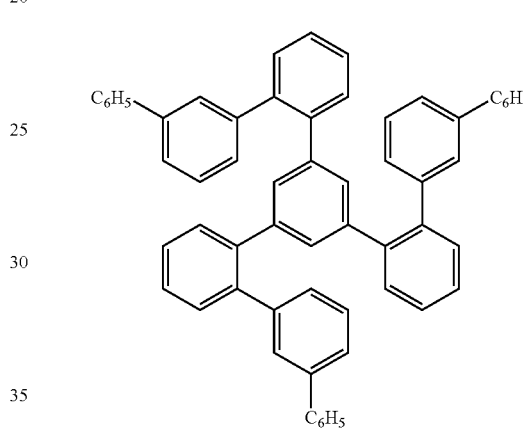
(19)
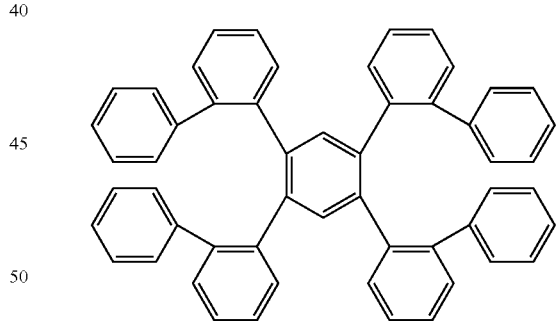
(20)
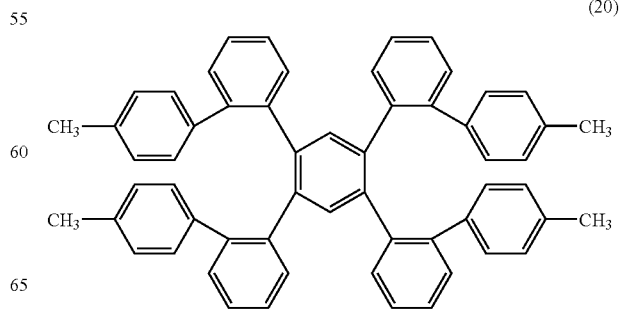

-continued
(21)
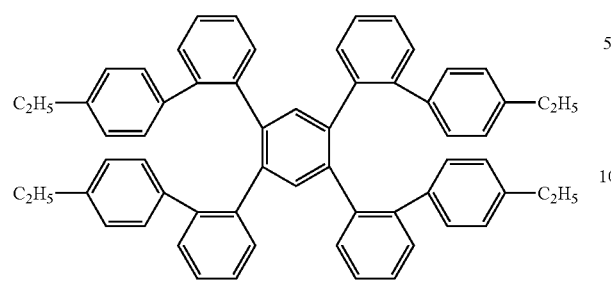
(22)
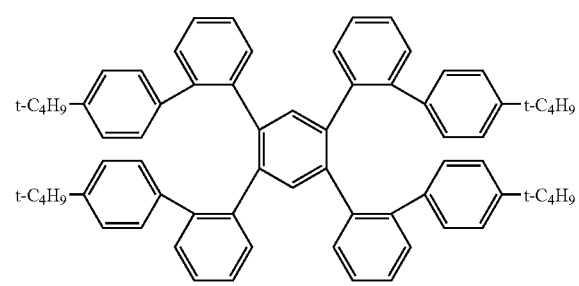
(23)
(24)
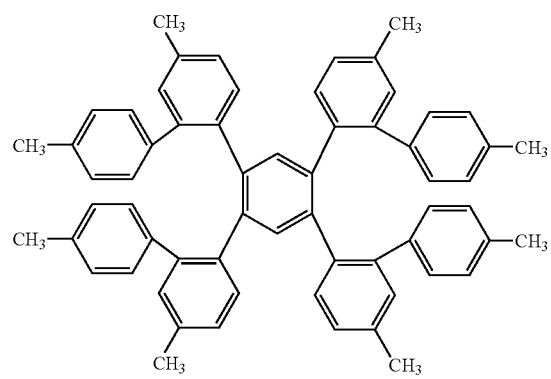
(25)
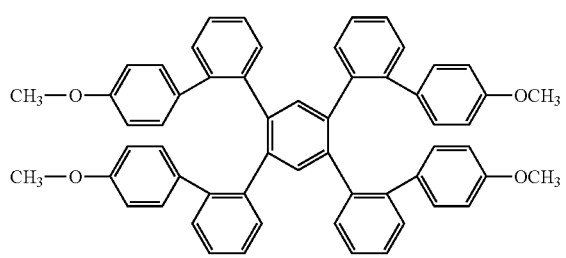
-continued
(26)
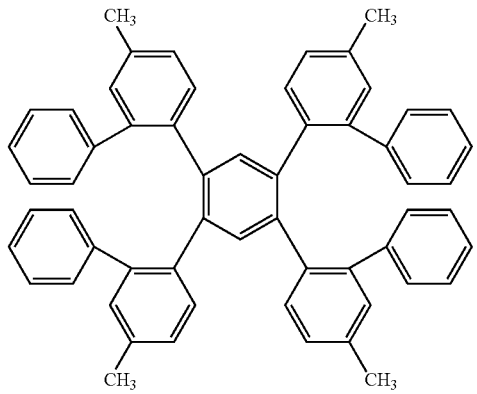
(27)
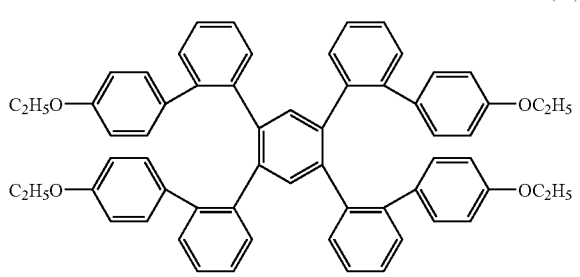
(28)
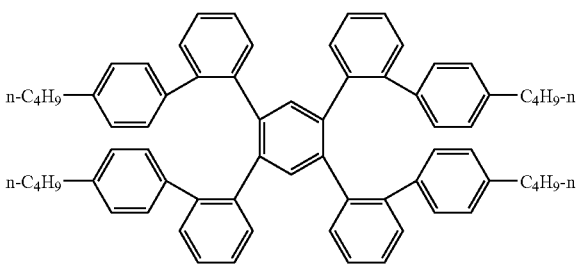
(29)
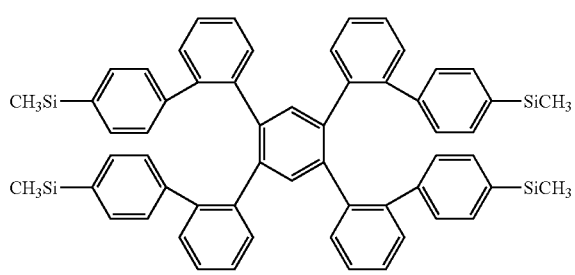

-continued
(30)
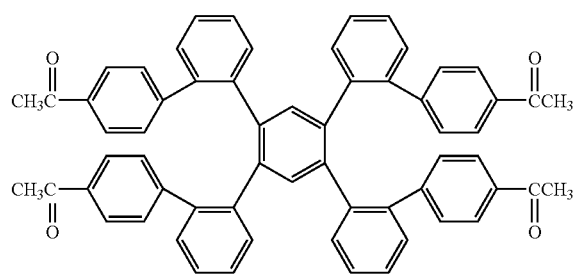
(31)
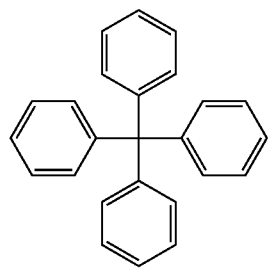
(32)
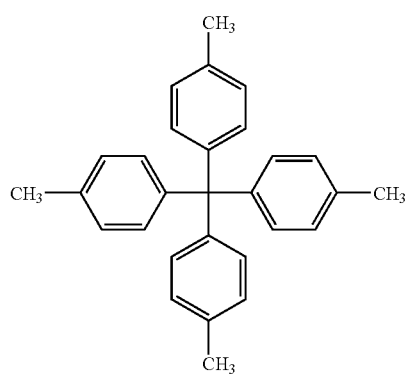
(33)
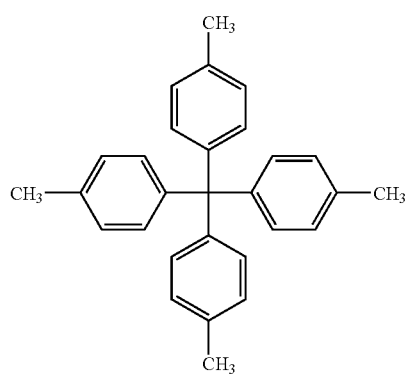
(34)
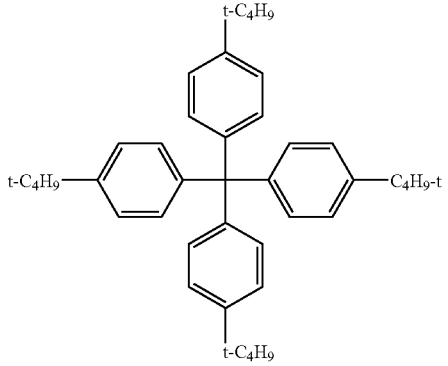
(35)
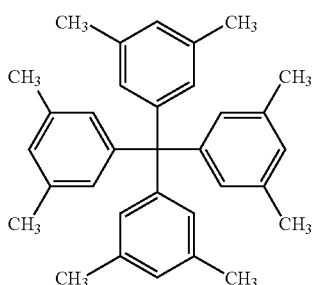
(36)
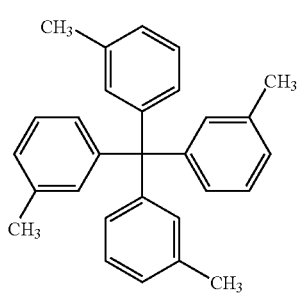
(37)
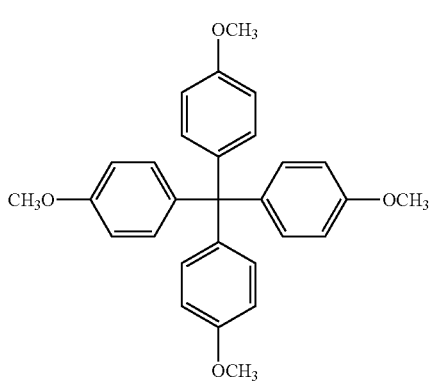

-continued
(38)
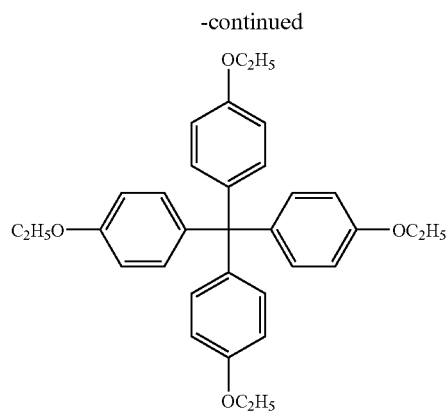
(39)
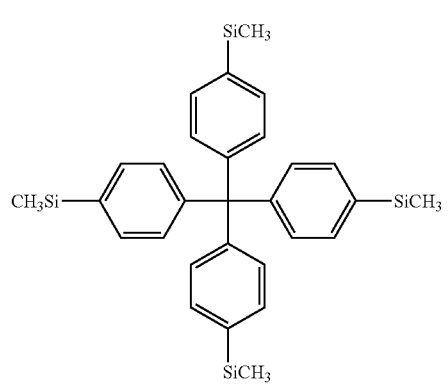
(40)
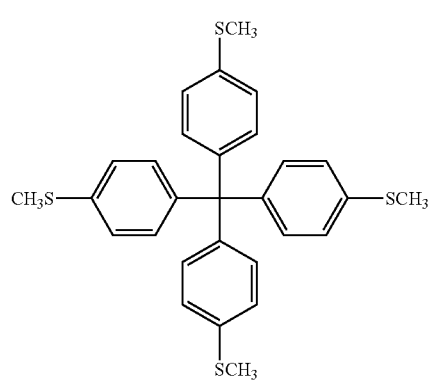
(41)
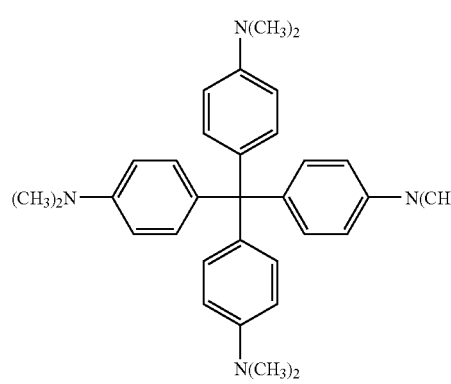
-continued
(42)
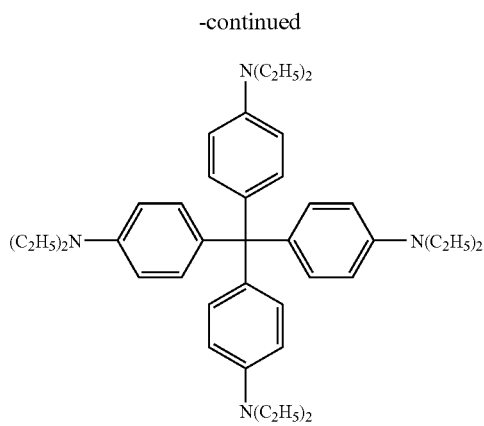
(43)
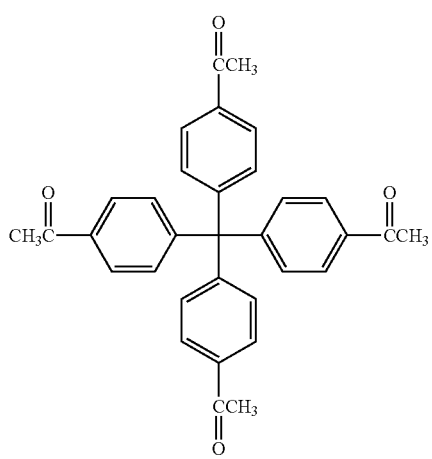
(44)
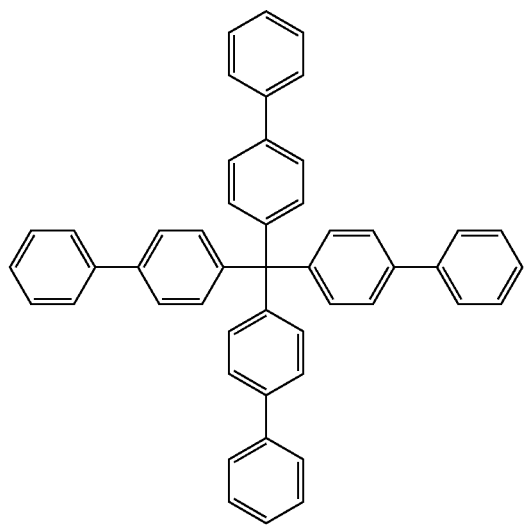

(45)
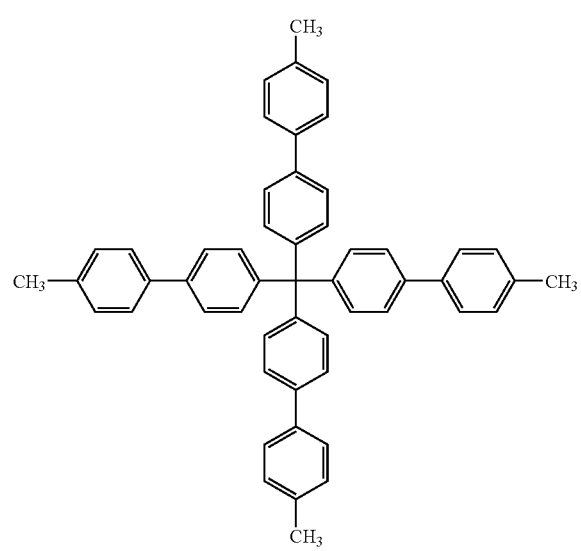
(46)
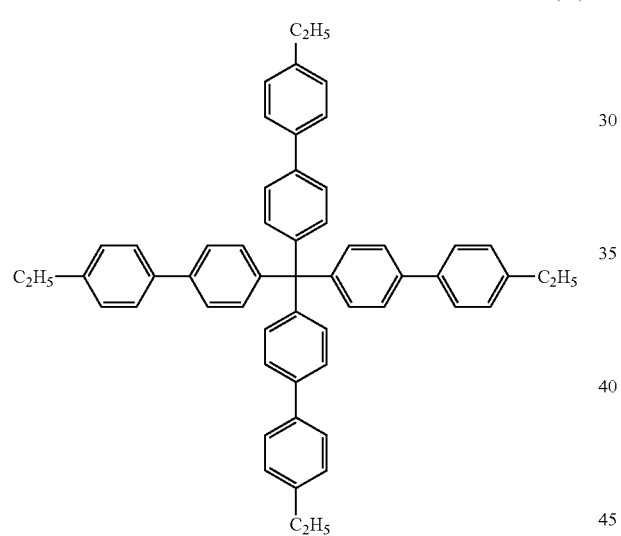
(47)
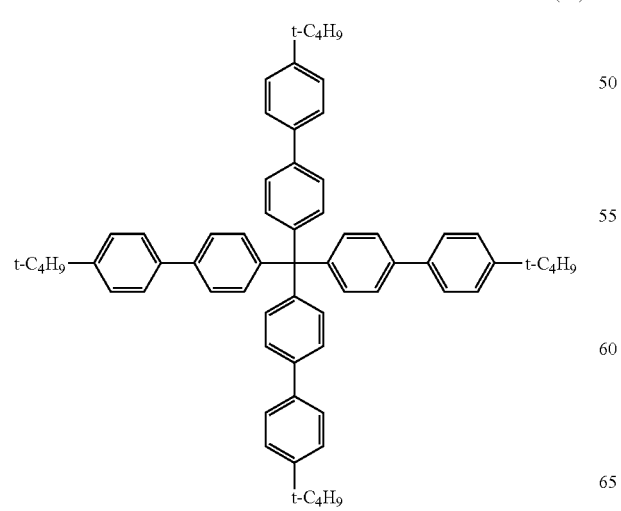
(48)
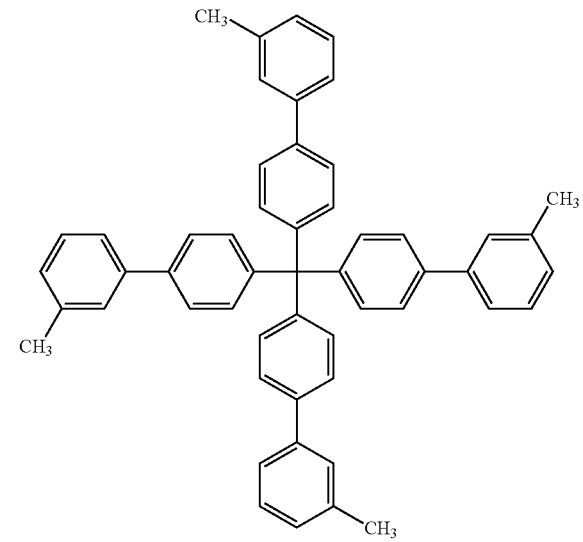
(49)
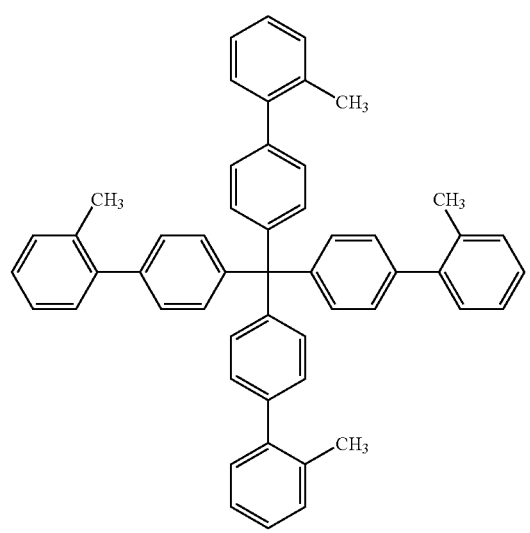
(50)
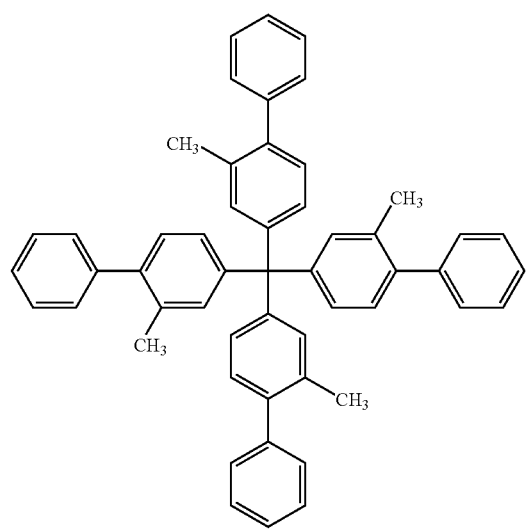

-continued
(51)
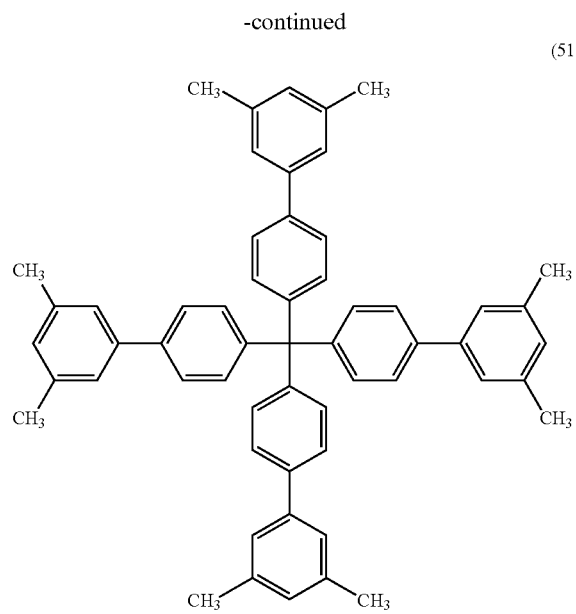
(52)
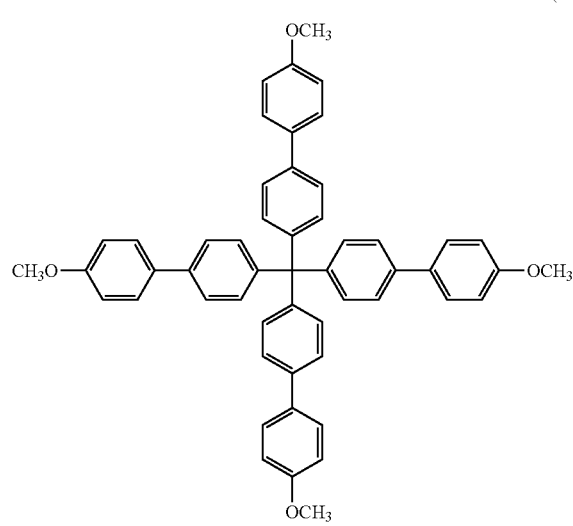
(53)
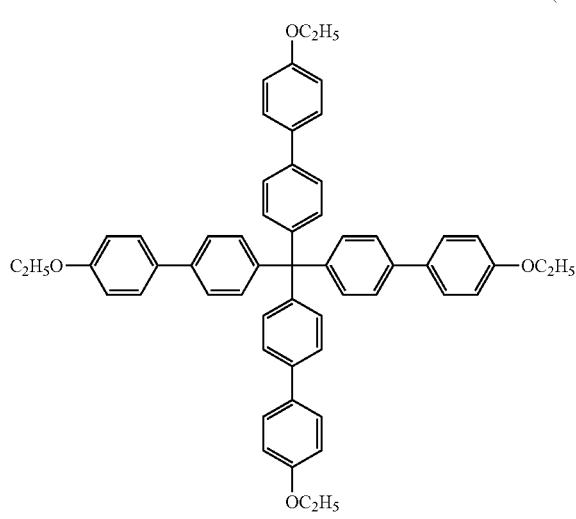
(54)
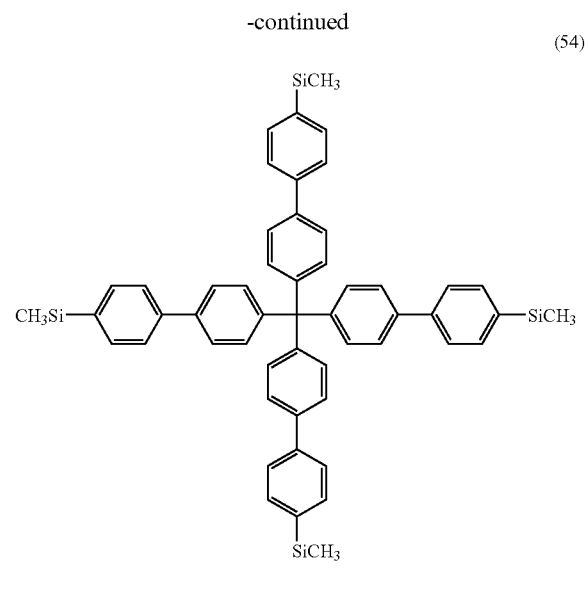
(55)
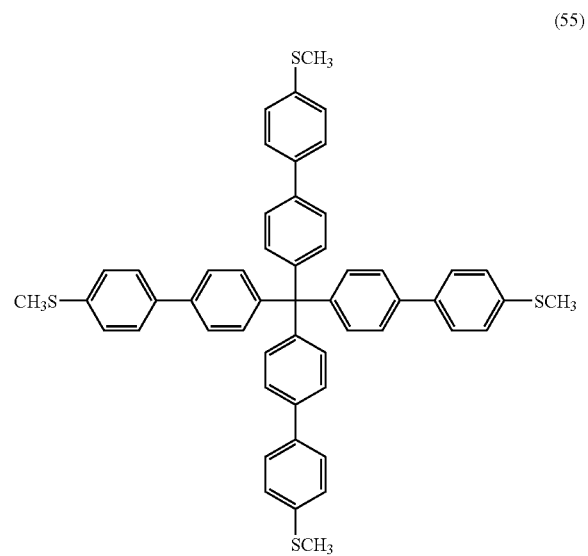
(56)
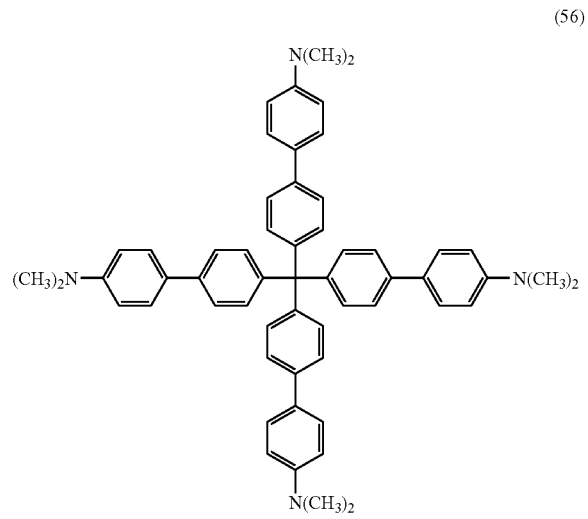

-continued (57)

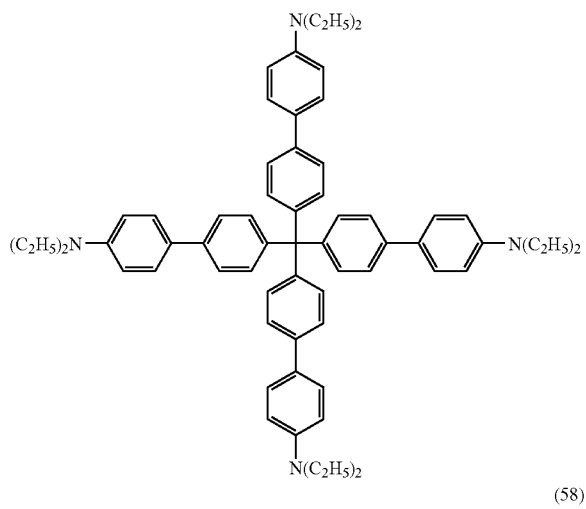

(58)

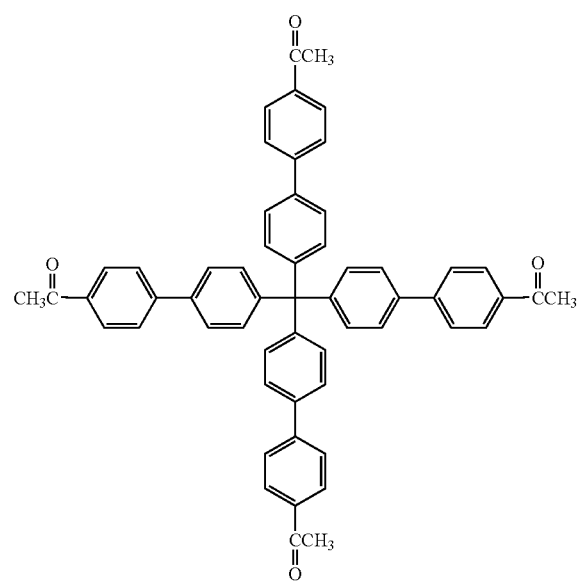

The construction of the organic electroluminescent device of the invention and the like will be described below in detail.

Organic Compound Layer

Construction of Organic Compound Layer

The position of the organic compound layer to be formed in the organic electroluminescent device is not particularly limited and can be adequately selected depending upon the application and purpose of the organic electroluminescent device. But, it is preferable that the organic compound layer is formed on a transparent electrode (preferably an anode) or a back electrode (preferably a cathode). In this case, the organic compound layer is formed entirely or partially on the surface of the transparent electrode or on the surface of the back electrode.

The shape, size, thickness, etc. of the organic compound layer are not particularly limited and can be adequately selected depending upon the purpose.

Specific examples of the layer construction of the organic electroluminescent device of the invention including the organic compound layer include anode/hole transport layer/light emitting layer/electron transport layer/cathode, anode/hole transport layer/light emitting layer/block layer/electron transport layer/cathode, anode/hole transport layer/light emitting layer/block layer/electron transport layer/electron injection layer/cathode, anode/hole injection layer/hole transport layer/light emitting layer/block layer/electron transport layer/cathode, and anode/hole injection layer/hole transport layer/light emitting layer/block layer/electron transport layer/electron injection layer/cathode. However, it should not be construed that the invention is limited thereto.

Hole Transport Layer

In the invention, the hole transport layer contains a hole transport material. The hole transport material is not limited so far as it has either one of a function to transport a hole or a function to block an electron injected from the cathode, and any of low molecular hole transport materials and high molecular hole transport materials can be used. Examples thereof are as follows.

That is, examples of the hole transport material include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine deriveatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene compounds, porphyrin compounds, polysilane compounds, poly(N-vinylcarbazole) derivatives, conductive high molecular oligomers (e.g. aniline copolymers, thiophene oligomers, and polythiophenes), and high molecular compounds (e.g. polythiophene derivatives, polyphenylene derivatives, polyphenylenevinylene derivatives, and polyfluorene deriveatives).

These compounds may be used singly or in combinations of two or more kinds thereof.

The thickness of the hole transport layer is preferably from 10 to 200 nm, and more preferably from 20 to 80 nm. When the thickness falls within the foregoing range, not only the drive voltage is kept within the proper range, but also short circuit of the organic electroluminescent device is prevented from occurring.

In the invention, it is possible to provide a hole injection layer between the hole transport layer and the anode.

The hole injection layer as referred to herein is a layer for making it easy to inject a hole from the anode into the hole transport layer. Specifically, of the foregoing hole transport materials, materials having a low ionization potential are suitably used. Examples of the material which can be suitably used include phthalocyanine compounds, porphyrin compounds, and starburst type triarylamine compounds.

The thickness of the hole injection layer is preferably from 1 to 30 nm.

Light Emitting Layer

As described previously, in the invention, the light emitting layer contains at least one kind of a light emitting material and the foregoing electrically inactive organic compound.

The light emitting material in the invention is not particularly limited, and any of a fluorescent material and a phosphorescent material can be used. Of these, a phosphorescent material is preferable in view of the luminous efficiency.

Examples of the fluorescent material include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perynone derivatives, oxadiazole derivatives, aldazine derivatives, pyrralizine derivatives, cyclopentadiene derivatives, bisstyrylanthracene derivatives, quinacridone derivatives, pyrrolopyridine derivatives, thiadiazolopyridine derivatives, styrylamine derivatives, aromatic dimethylidene derivatives, various metal complexes (e.g. metal or rare earth metal complexes of 8-quinolyl derivatives), and high molecular compounds (e.g. polythiophene derivatives, polyphenylene derivatives, polyphenylenevinylene derivatives, and polyfluorene derivatives). These compounds can be used singly or in admixture of two or more kinds thereof.

The phosphorescent material is not particularly limited, but orthometalated metal complexes and porphyrin metal complexes are preferable.

The term "orthometalated metal complex" as referred to herein is a general term of the group of compounds described in, for example, Akio Yamamoto, *Yukikinzoku-Kagaku, Kiso to Oyo* (Metalorganic Chemistry, Foundation and Application), page 150 and page 232, published by Shokabo Publishing Co., Ltd. (1982); and H. Yersin, *Photochemistry and Photophysics of Coordination Compounds*, pp. 71-77 and pp. 135-146, published by Springer-Verlag (1987). What the orthometalated metal complex is used as the light emitting material in the light emitting layer is advantageous from the standpoints of revealing high luminance and excellent luminous efficiency.

As the ligand which forms the orthometalated metal complex, various ligands are known and described in the documents as cited previously. Of those ligands, 2-phenylpyridine derivatives, 7,8-benzoquinoline derivatives, 2-(2-thienyl)pyridine derivatives, 2-(1-naphthyl)pyridine derivatives, and 2-phenylquinoline derivatives are preferable. These derivatives may have a substituent as the need arises. Also, the orthometalated metal complex may have other ligand in addition to the foregoing ligands.

The orthometalated metal complex in the invention can be synthesized by various known methods as described in, for example, *Inorg Chem.*, 1991, No. 30, page 1685, ibid., 1988, No. 27, page 3464, ibid., 1994, No. 33, page 545, *Inorg. Chim. Acta*, 1991, No. 181, page 245, *J. Organomet. Chem.*, 1987, No. 335, page 293, and *J. Am. Chem. Soc.*, 1985, No. 107, page 1431.

Of the foregoing orthometalated metal complexes, compounds capable of undergoing light emission from a triplet exciton can be suitably used in the invention from the viewpoint of enhancing the luminous efficiency.

Also, of the porphyrin metal complexes, a porphyrin platinum complex is preferable.

The phosphorescent material may be used singly or in combinations of two or more kinds thereof. Also, the fluorescent material and the phosphorescent material may be used at the same time.

The electrically inactive organic compound may be used singly or in combinations of two or more kinds thereof.

The content of the electrically inactive organic compound in the light emitting layer is preferably from 5 to 98% by weight, and more preferably from 10 to 95% by weight.

Block Layer

In the invention, it is possible to provide a block layer between the light emitting layer and the electron transport layer. The block layer as referred to herein means a layer which blocks diffusion of an exciton formed in the light emitting layer. Also, the block layer is a layer which blocks pass-through of the hole into the cathode side.

The material in the block layer is not particularly limited so far as it can receive an electron from the electron transport layer and transfer it into the light emitting layer, and general electron transport materials can be used. Examples of the material are as follows.

That is, examples of the material to be used in the block layer include triazole derivatives, oxazole derivatives, oxadiazole derivatives, fluorenone derivatives, anthraquinodimethane derivatives, anthrone derivatives, diphenylquinone derivatives, thiopyrane dioxide derivatives, carbodiimide derivatives, fluorenylidenemethane derivatives, distyrylpyrazine derivatives, heterocyclic tetracarboxylic anhydrides (e.g. naphthaleneperylenes), phthalocyanine derivatives, various metal complexes (e.g. metal complexes of 8-quinolinol derivatives and metal complexes having metal phthalocyanine, benzoxazole, or benzothiazole as a ligand), conductive high molecular oligomers (e.g. aniline copolymers, thiophene oligomers, and polythiophenes), and high molecular compounds (e.g. polythiophene derivatives, polyphenylene derivatives, polyphenylenevinylene derivatives; and polyfluorene deriveatives). These compounds may be used singly or in combinations of two or more kinds thereof.

The thickness of the block layer is preferably from 5 to 30 nm.

Electron Transport Layer

In the invention, it is possible to provide an electron transport layer containing an electron transfer material.

As the electron transport material, any material can be used without particular limitations so far as it has either a function to transport an electron or a function to block a hole injected from the anode, and the electron transport materials enumerated in the foregoing description of the block layer can be suitably used.

The thickness of the electron transport layer is preferably from 10 to 200 nm, and more preferably from 20 to 80 nm from the viewpoints of keeping the drive voltage within a proper range and causing no short circuit of the organic electroluminescent device.

In the invention, it is possible to provide an electron injection layer between the electron transport layer and the cathode.

The electron injection layer as referred to herein is a layer for making it easy to inject an electron from the cathode into the electron transport layer. Specifically, lithium salts such as lithium fluoride, lithium chloride, and lithium bromide; alkali metal salts such as sodium fluoride, sodium chloride, and cesium fluoride; insulating metal oxides such as lithium oxide, aluminum oxide, indium oxide, and magnesium oxide; and the like can be suitably used.

The thickness of the electron injection layer is from 0.1 to 5 nm.

Formation of Organic Compound Layer

The organic compound layer can be suitably subjected to film formation by any of the dry film formation process (for example, vapor deposition process and sputtering process) and the wet film formation process (for example, dipping, spin coating process, dip coating process, casting process, die coating process, roll coating process, bar coating process, and gravure coating process).

Of these, the dry film formation process is preferable from the standpoints of luminous efficiency and durability.

Substrate

As a material of the substrate, materials which do not permeate moisture or materials having an extremely low permeability of moisture are preferable. Also, materials which do not scatter and/or decay light emitted from the organic compound layer are preferable. Examples thereof include inorganic materials such as YSZ (yttrium stabilized zirconia) and glass; and organic materials such as polyesters (for example, polyethylene terephthalate, polybutylene terephthalate, and polyethylene naphthalate) and synthetic resins (for example, polystyrene, polycarbonates, polyether sulfones, polyacrylates, allyl diglycol carbonates, polyimides, polycycloolefins, norbornene resins, and poly(chlorotrifluoroethylene)). In the case of the organic material, it is preferable that the material is excellent with respect to heat resistance, dimensional stability, solvent resistance, electric insulating properties, processability, low air permeability, low hygroscopicity, etc. Of these, in the case where the material of the transparent electrode is indium tin oxide (ITO) which is suitably used as the transparent electrode, materials having a small difference in lattice constant from the indium tin oxide (ITO) are preferable. These materials may be used singly or in combinations with two or more kinds thereof.

The substrate is not particularly limited with respect to the shape, structure, size, etc. and can be adequately selected depending upon the application, purpose, etc. of the organic electroluminescent device. In general, the shape may be a plate-like shape. The structure may be a single-layered structure or a laminated structure, and the substrate may be made of a single material or two or more materials.

The substrate may be colorless and transparent, or may be colored and transparent. However, a colorless and transparent substrate is preferable from the standpoint that it does not scatter or decay the light emitted from the light emitting layer.

It is preferable that the substrate is provided with an anti-moisture permeable layer (gas barrier layer) on the front surface or rear surface (in the transparent electrode side).

As a material of the anti-moisture permeable layer (gas barrier layer), inorganic materials such as silicon nitride and silicon oxide are suitably used. The anti-moisture permeable layer (gas barrier layer) can be formed by, for example, the high-frequency sputtering process.

If desired, the substrate may be provided with a hard coat layer, an undercoat layer, etc.

Anode

As the anode, in general, any material having a function to feed a hole into the organic compound layer may be employed and is not particularly limited with respect to the shape, structure, size, etc. It can be adequately selected among known electrodes depending upon the application and purpose of the organic electroluminescent device.

As a material of the anode, for example, metals, alloys, metal oxides, organic conductive compounds, and mixtures thereof are suitably enumerated. Of these, materials having a work function of 4.0 eV or more are preferable. Specific examples thereof include semiconducting metal oxides such as tin oxide doped with antimony, fluorine, etc. (ATO or FTO), tin oxide, zinc oxide, indium oxide, indium tin oxide (ITO), and indium zinc oxide (IZO); metals such as gold, silver, chromium, and nickel; mixtures or layered products of these metals with conductive metal oxides; inorganic conductive substances such as copper iodide and copper sulfide; organic conductive materials such as polyaniline, polythiophene, and polypyrrole; and layered products thereof with ITO.

It is possible to form the anode on the substrate according to a method which is adequately selected among wet systems (for example, printing system and coating system), physical systems (for example, vacuum vapor deposition process, sputtering process, and ion plating process), and chemical systems (for example, CVD and plasma CVD process) while taking into consideration adaptivity with the foregoing material. For example, in the case where ITO is selected as the material of the anode, the formation of the anode can be carried out according to the direct current or high-frequency sputtering process, the vacuum vapor deposition process, the ion plating process, etc. Also, in the case where an organic conductive compound is selected as the material of the anode, the formation of the anode can be carried out according to the wet film formation process.

In the organic electroluminescent device of the invention, the position at which the anode is formed is not particularly limited and can be adequately selected depending upon the application and purpose of the organic electroluminescent device. However, it is preferable that the anode is formed on the substrate. In this case, the anode may be formed entirely or partially on the one surface of the substrate.

The patterning of the anode may be carried out by chemical etching by photolithography, etc. or physical etching using laser, etc. Also, the patterning of the anode may be carried out by vacuum vapor deposition or sputtering by superimposing a mask, or may be carried out by the lift-off process or the printing process.

The thickness of the anode can be adequately selected depending upon the material. Though the thickness of the anode cannot be unequivocally defined, it is usually from 10 nm to 50 µm, and preferably from 50 nm to 20 µm.

The resistance value of the anode is preferably not more than $10^3$ Ω/□, and more preferably not more than $10^2$ Ω/□.

In order to take out light emission from the anode side, its transmittance is preferably 60% or more, and more preferably 70% or more. This transmittance can be measured according to a known method using a spectrophotometer. Also, in this case, the anode may be colorless and transparent, or may be colored and transparent.

The anode is described in detail in *Tomei-Denkyokumaku no Shintenkai* (New Development of Transparent Electrode Films), supervised by Yutaka Sawada and published by CMC Publishing Co., Ltd. (1999), and the described materials can be applied in the invention. In the case where a plastic substrate having low heat resistance is used, an anode prepared by film formation at low temperatures of not higher than 150° C. using ITO or IZO is preferable.

Cathode

As the cathode, in general, any material having a function as a cathode to inject an electron into the organic compound layer may be employed and is not particularly limited with respect to the shape, structure, size, etc. It can be adequately selected among known electrodes depending upon the application and purpose of the organic electroluminescent device.

As a material of the cathode, for example, metals, alloys, metal oxides, electrically conductive compounds, and mixtures thereof are suitably enumerated. Of these, materials having a work function of not more than 4.5 eV are preferable. Specific examples thereof include alkali metals (for example, Li, Na, K, and Cs), alkaline earth metals (for example, Mg and Ca), gold, silver, lead, aluminum, sodium-potassium alloys, lithium-aluminum alloys, magnesium-silver alloys, and rare earth metals (for example, indium and ytterbium). Though these materials may be used singly, they are preferably used in combinations of two or more kinds thereof from the viewpoint of coping with both stability and electron injection properties.

Of these, alkali metals and alkaline earth metals are preferable from the viewpoint of electron injection properties, and materials composed mainly of aluminum are preferable because they have excellent storage stability.

The term "material composed mainly of aluminum" as referred to herein means aluminum alone or an alloy or mixture of aluminum and from 0.01 to 10% by weight of an alkali metal or an alkaline earth metal (for example, lithium-aluminum alloys and magnesium-aluminum alloys).

The material of the cathode is described in detail in JP-A-2-15595 and JP-A-5-121172.

The formation method of the cathode is not particularly limited and can be carried out according to known methods. For example, the cathode can be formed on the substrate according to a method which is adequately selected among wet systems (for example, printing system and coating system), physical systems (for example, vacuum vapor deposition process, sputtering process, and ion plating process), and chemical systems (for example, CVD and plasma CVD process) while taking into consideration adaptivity with the foregoing material. For example, in the case where a metal, etc. is selected as the material of the cathode, the cathode can be formed on the substrate by sputtering one or two or more kinds thereof simultaneously or successively.

The patterning of the cathode may be carried out by chemical etching by photolithography, etc. or physical etching using laser, etc. Also, the patterning of the anode may be carried out by vacuum vapor deposition or sputtering by superimposing a mask, or may be carried out by the lift-off process or the printing process.

The position at which the cathode is formed in the organic electroluminescent device is not particularly limited and can be adequately selected depending upon the application and purpose of the organic electroluminescent device. However, it is preferable that the cathode is formed on the organic compound layer. In this case, the cathode may be formed entirely or partially on the one surface of the organic compound layer.

Also, a dielectric layer made of a fluoride of an alkali metal or alkaline earth metal may be inserted in a thickness of from 0.1 to 5 nm between the cathode and the organic compound layer. The dielectric layer can be, for example, formed by the vacuum vapor deposition process, the sputtering process, the ion plating process, etc.

The thickness of the cathode can be adequately selected depending upon the material to be used. Though the thickness of the cathode cannot be unequivocally defined, it is usually from 10 nm to 5 µm, and preferably from 50 nm to 1 µm.

The cathode may be transparent or opaque. The transparent cathode can be formed by subjecting the material of the cathode to film formation into a thin thickness of from 1 to 10 nm and further laminating a transparent conductive material such as ITO and IZO thereon.

Other Layers

In the organic electroluminescent device of the invention, other layers than those described above may be provided. Such other layers can be adequately selected without particular limitations depending upon the purpose, and examples thereof include a protective layer.

As the protective layer, those described in, for example, JP-A-7-85974, JP-A-7-192866, JP-A-8-22891, JP-A-10-275682, and JP-A-10-106746 are suitably enumerated.

In the light emitting layered product comprising an electrode and an organic compound layer, the protective layer is formed on the superficial surface layer. For example, in the case where the substrate, the anode, the organic compound layer, and the cathode are stacked in this order, the protective layer is formed on the cathode; and in the case where the substrate, the cathode, the organic compound layer, and the anode are stacked in this order, the protective layer is formed on the anode.

The shape, size, thickness, etc. of the protective layer can be adequately selected, and any material having a function to block invasion and/or permeation of a substance which likely deteriorates the organic electroluminescent device (for example, moisture and oxygen) into the organic electroluminescent device can be used without particular limitations. Examples thereof include silicon oxide, silicon dioxide, germanium oxide, and germanium dioxide.

The formation method of the protective layer is not particularly limited, and examples thereof include vacuum vapor deposition process, sputtering process, reactive sputtering process, molecular epitaxy process, cluster ion beam process, ion plating process, plasma polymerization process, plasma CVD process, laser CVD process, heat CVD process, and coating process.

Further, in the invention, it is also preferred to provide a sealing layer for the purpose of preventing invasion of moisture or oxygen into the respective layers of the organic electroluminescent device.

Examples of a material of the sealing layer include copolymers containing tetrafluoroethylene and at least one comonomer; fluorine-containing copolymers having a cyclic structure in the principal chain thereof; polyethylene, polypropylene, polymethyl methacrylate, polyimides, polyureas, polytetrafluoroethylene, polychlorotrifluoroethylene, polydichlorodifluoroethylene, and copolymers of two or more kinds selected from chlorotrifluoroethylene and dichlorodifluoroethylene; water absorbing substances having a water absorption of 1% or more; moisture-proof substances having a water absorption of not more than 0.1%, metals (for example, In, Sn, Pb, Au, Cu, Ag, Al, Tl, and Ni); metal oxides (for example, MgO, SiO, $SiO_2$, $Al_2O_3$, GeO, NiO, CaO, BaO, $Fe_2O_3$, $Y_2O_3$, and $TiO_2$); metal fluorides (for example, $MgF_2$, LiF, $AlF_3$, and $CaF_2$); liquid fluorinated hydrocarbons (for example, perfluoroalkanes, perfluoroamines, and perfluoroethers); and liquid fluorinated hydrocarbons having dispersed therein an adsorbing agent capable of adsorbing moisture or oxygen.

In the organic electroluminescent device of the invention, light emission can be obtained by applying a voltage (usually from 2 to 4 volts) of direct current (which may contain an alternating current component, if desired) or a direct current between the anode and the cathode.

With respect to the drive of the organic electroluminescent device of the invention, methods described in JP-A-2-148687, JP-A-6-301355, JP-A-5-29080, JP-A-7-134558, JP-A-8-234685, JP-A-8-241047, U.S. Pat. Nos. 5,828,429 and 6,023,308, and Japanese Patent No. 2,784,615 can be utilized.

EXAMPLES

The organic electroluminescent device of the invention will be described below with reference to the following Examples, but it should not be construed that the invention is limited to these Examples.

Example 1

A glass sheet of 0.5 mm in thickness and 2.5 cm in square was used as a substrate. This substrate was introduced into a vacuum chamber, and an ITO thin film (thickness: 0.2 µm) was formed as a transparent electrode using an ITO target (indium/tin=95/5 by mole) having an $SnO_2$ content of 10% by weight by means of DC magnetron sputtering (condition: substrate temperature of 250° C. and oxygen pressure of $1 \times 10^{-3}$ Pa). The ITO thin film had a surface resistance of 10 Ω/□.

Next, the substrate having the transparent electrode formed thereon was charged in a cleaning vessel, cleaned with IPA, and then subjected to UV-ozone processing for 30 minutes.

A hole injection layer was provided in a thickness of 0.01 µm on the transparent electrode by vapor deposition of copper phthalocyanine by the vacuum vapor deposition process at a rate of 1 nm/sec. A hole transport layer was provided in a thickness of 0.03 µm on the hole injection layer by vapor deposition of N,N'-dinaphthyl-N,N'-diphenylbenzidine by the vacuum deposition process at a rate of 1 nm/sec.

A light emitting layer was provided in a thickness of 0.03 µm on the hole transport layer by co-vapor deposition of iridium(III) bis[(4,6-difluorophenyl)-pyridinato-N,C]picolinate (FIrpic) which is a phosphorescent material emitting blue light and the foregoing Compound (1) as an electrically inactive organic compound at a co-vapor deposition ratio of 30/70 (by mole) by the vacuum deposition process.

A block layer was provided on the light emitting layer. Using aluminum(III) bis(2-methyl-8-quinolinato)-4-phenylphenolate ($Balq_2$) as an electron transport material to be used in the block layer, the block layer was provided in a thickness of 0.01 µm by vapor deposition by the vacuum deposition process at rate of 1 nm/sec.

An electron transport layer was further provided in a thickness of 0.04 µm on the block layer by vapor deposition of tris(8-hydroxyquinolinato)aluminum ($Alq_3$) as an electron transport material by the vacuum vapor deposition process at a rate of 1 nm/sec.

An electron injection layer was further provided in a thickness of 0.002 µm on the electron transport layer by vapor deposition of LiF as an electron injection material at a rate of 1 nm/sec.

A patterned mask (a mask having a light emitting area of 5 mm×5 mm) was further placed on the electron injection layer, and aluminum was subjected to vapor deposition in a thickness of 0.25 µm within a vapor deposition unit, thereby forming a back electrode.

Aluminum lead wires were respectively wire bound from the transparent electrode (functioning as an anode) and the back electrode to form a light emitting layered product.

The resulting light emitting layered product was charged into a glove box purged with a nitrogen gas. 10 mg of a calcium oxide powder as a moisture adsorbing agent was charged in a stainless steel-made seal cover provided with a concave therein within the glove box, which was then fixed by an adhesive tape. This seal cover was sealed by a UV curable adhesive (XNR5516HV, manufactured by Nagase-CIBA Ltd.) as an adhesive.

There was thus prepared an organic electroluminescent device of Example 1.

The resulting organic electroluminescent device was evaluated in the following methods.

Using a source measure unit Mode 2400, manufactured by TOYO TECHNICA INC., a direct current voltage was applied to the organic electroluminescent device, thereby measuring an initial light emitting performance. At that time, the maximum luminance was defined as $L_{max}$, and the voltage at which $L_{max}$ was obtained was defined as $V_{max}$. Further, the luminous efficiency at the time of 1,000 $Cd/m^2$ was defined as an external quantum efficiency ($\eta_{1000}$) The results obtained are shown in Table 1.

Also, as a drive durability test, the organic electroluminescent device was continuously driven from an initial luminance of 1,000 $Cd/m^2$, and a time when the luminance became a half was determined in terms of half-time ($T_{1/2}$). The results obtained are shown in Table 1.

Also, Eg, T1 and Ip of the electrically inactive organic compound were confirmed in the following manners. The respective values are shown in Table 2.

Eg was determined from an absorption edge of an absorption spectrum of a vapor deposition film made of the electrically inactive organic compound singly.

T1 was determined from a rising wavelength obtained by cooling the sample of the electrically inactive organic compound under the liquid nitrogen temperature and measuring phosphorescence.

Ip was determined by placing the sample of the electrically inactive organic compound in the air and measuring it using an ultraviolet photoelectron spectrometer AC-1 (manufactured by RIKEN KEIKI CO., LTD.).

Example 2

A device was prepared and evaluated in the same manners as in Example 1, except that in Example 1, Compound (4) was used as the electrically inactive organic compound to be used in the light emitting layer in place of the Compound (1). The results obtained are shown in Tables 1 and 2.

Example 3

A device was prepared and evaluated in the same manners as in Example 1, except that in Example 1, Compound (11) was used as the electrically inactive organic compound to be used in the light emitting layer in place of the Compound (1). The results obtained are shown in Tables 1 and 2.

Example 4

A device was prepared and evaluated in the same manners as in Example 1, except that in Example 1, Compound (20) was used as the electrically inactive organic compound to be used in the light emitting layer in place of the Compound (1). The results obtained are shown in Tables 1 and 2.

Example 5

A device was prepared and evaluated in the same manners as in Example 1, except that in Example 1, Compound (35) was used as the electrically inactive organic compound to be used in the light emitting layer in place of the Compound (1). The results obtained are shown in Tables 1 and 2.

Example 6

A device was prepared and evaluated in the same manners as in Example 1, except that in Example 1, Compound (44) was used as the electrically inactive organic compound to be used in the light emitting layer in place of the Compound (1). The results obtained are shown in Tables 1 and 2.

Comparative Example 1

A device was prepared and evaluated in the same manners as in Example 1, except that in Example 1, the Compound (1) which is the electrically inactive organic compound to be used in the light emitting layer was not used and that the light emitting layer was provided in a thickness of 0.03 µm by co-vapor deposition of CBP as a host material at a ratio of FIrpic which is a blue phosphorescent material to CBP of 5/100 (by mole) by the vacuum vapor deposition process. The results obtained are shown in Tables 1 and 2.

Example 7

A device was prepared and evaluated in the same manners as in Example 1, except that in Example 1, tris(2-phenylpyridyl)iridium complex ($Ir(ppy)_3$) which is a phosphorescent material emitting green light was used in place of the FIrpic to be used in the light emitting layer. The results obtained are shown in Tables 1 and 2.

Comparative Example 2

A device was prepared and evaluated in the same manners as in Example 7, except that in Example 7, the Compound (1) which is the electrically inactive organic compound to be used in the light emitting layer was not used and that the light emitting layer was provided in a thickness of 0.03 µm by co-vapor deposition of CBP as a host material at a ratio of $Ir(ppy)_3$ which is a green phosphorescent material to CBP of 5/100 (by mole). The results obtained are shown in Table 1.

TABLE 1

| | $L_{max}$ (Cd/m$^2$) | $V_{max}$ (V) | $\eta_{1000}$ (%) | $T_{1/2}$ (hour) |
|---|---|---|---|---|
| Example 1 | 37,000 | 13 | 11.5 | 1,500 |
| Example 2 | 42,000 | 15 | 12.1 | 1,700 |
| Example 3 | 35,000 | 14 | 11.3 | 1,500 |
| Example 4 | 28,000 | 14 | 11.2 | 1,400 |
| Example 5 | 38,000 | 14 | 12.0 | 1,400 |
| Example 6 | 43,000 | 14 | 11.5 | 1,300 |
| Example 7 | 78,000 | 15 | 18.4 | 6,500 |
| Comparative Example 1 | 15,000 | 10 | 6.1 | 400 |
| Comparative Example 2 | 55,000 | 15 | 11.5 | 1,200 |

TABLE 2

| | Electrically inactive organic compound | Eg (eV) | Ip (eV) | T1 (eV) |
|---|---|---|---|---|
| Example 1 | (1) | 4.2 | 6.3 | 2.8 |
| Example 2 | (4) | 4.1 | 6.2 | 2.7 |
| Example 3 | (11) | 4.2 | 6.3 | 2.8 |
| Example 4 | (20) | 4.1 | 6.2 | 2.7 |
| Example 5 | (35) | 4.0 | 6.2 | 2.7 |
| Example 6 | (44) | 4.0 | 6.3 | 2.8 |
| Example 7 | (1) | 4.2 | 6.3 | 2.8 |
| Comparative Example 1 | CBP | 3.3 | 6.0 | 2.6 |
| Comparative Example 2 | CBP | 3.3 | 6.0 | 2.6 |

Example 8

A device was prepared and evaluated in the same manners as in Example 1, except that in Example 1, the following Compound (A-1) which is a phosphorescent material emitting red light was used in place of FIrpic to be used in the light emitting layer. The luminous efficiency at the time of 300 Cd/m$^2$ is shown in Table 3 as an external quantum efficiency ($\eta_{300}$).

Also, the drive durability test was carried out at an initial luminance of 300 Cd/m$^2$, and a time when the luminance became a half was determined in terms of half-time ($T_{1/2}$). The test results obtained are shown in Table 3.

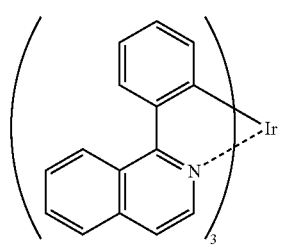

A-1

Comparative Example 3

A device was prepared and evaluated in the same manners as in Example 8, except that in Example 8, the Compound (1) which is the electrically inactive organic compound to be used in the light emitting layer was not used and that the light emitting layer was provided in a thickness of 0.03 μm by co-vapor deposition of CBP as a host material at a ratio of the Compound (A-1) which is a red phosphorescent material to CBP of 5/100 (by mole). The results obtained are shown in Table 3.

TABLE 3

| | $L_{max}$ (Cd/m$^2$) | $V_{max}$ (V) | $\eta_{300}$ (%) | $T_{1/2}$ (hour) |
|---|---|---|---|---|
| Example 8 | 42,000 | 14 | 12.4 | 55,000 |
| Comparative Example 3 | 23,000 | 14 | 8.1 | 2,500 |

Example 9

A device was prepared and evaluated in the same manners as in Example 1, except that in Example 1, the following Compound (A-2) which is a phosphorescent material was used in place of FIrpic to be used in the light emitting layer. The luminous efficiency at the time of 1,000 Cd/m$^2$ is shown in Table 4 as an external quantum efficiency ($\eta_{1000}$).

Also, the drive durability test was carried out at an initial luminance of 1,000 Cd/m$^2$, and a time when the luminance became a half was determined in terms of half-time ($T_{1/2}$). The test results obtained are shown in Table 4.

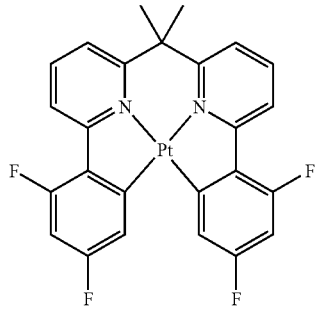

A-2

Comparative Example 4

A device was prepared and evaluated in the same manners as in Example 9, except that in Example 9, the Compound (1) which is the electrically inactive organic compound to be used in the light emitting layer was not used and that the light emitting layer was provided in a thickness of 0.03 μm by co-vapor deposition of CBP as a host material at a ratio of the Compound (A-2) which is a phosphorescent material to CBP of 5/100 (by mole). The results obtained are shown in Table 4.

TABLE 4

| | $L_{max}$ (Cd/m$^2$) | $V_{max}$ (V) | $\eta_{1000}$ (%) | $T_{1/2}$ (hour) |
|---|---|---|---|---|
| Example 9 | 72,000 | 16 | 10.5 | 3,300 |
| Comparative Example 4 | 28,000 | 16 | 7.2 | 800 |

From these results, it is noted that the organic electroluminescent devices of the invention containing an electrically inactive organic compound having an Eg of 4.0 eV or more in the light emitting layer are remarkably excellent with respect to the luminance, luminous efficiency and durability as compared with the organic electroluminescent devices of the Comparative Examples which do not contain such an electrically inactive organic compound.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

This application is based on Japanese Patent Application Nos. JP2004-66781 and JP2005-21268, filed on Mar. 10, 2004, and Jan. 28, 2005, respectively, the contents of which is incorporated herein by reference.

What is claimed is:

1. An organic electroluminescent device comprising:
a pair of electrodes;
an organic compound layer between the pair of electrodes, the organic compound layer comprising a light emitting layer, wherein the light emitting layer comprises: a light emitting material; and
an electrically inactive organic compound capable of being subjected to dry film formation, the electrically inactive organic compound having an energy difference Eg between a highest occupied molecular orbital and a lowest unoccupied molecular orbital of 4.0 eV or more,
wherein the electrically inactive organic compound is a compound represented by formula (1):

   Formula (1)

wherein Ar represents a group represented by formula (2); L represents a trivalent or tetravalent benzene skeleton; and m represents an integer of 3 or 4:

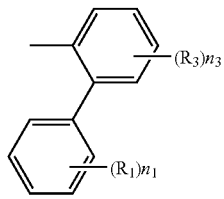   Formula (2)

wherein $R_1$ represents a substituent; $n_1$ represents an integer of 0 to 2, when plural $R_1$s are present, the plural $R_1$s are the same or different; $R_3$ represents a substituent; $n_3$ represents an integer of 0 to 1 and when plural $R_3$s are present, the plural $R_3$s are the same or different.

2. The organic electroluminescent device of claim 1, wherein the light emitting material comprises a phosphorescent material.

3. The organic electroluminescent device of claim 2, wherein the phosphorescent material is an orthometalated metal complex or a porphyrin metal complex.

4. The organic electroluminescent device of claim 1, wherein the electrically inactive organic compound has a triplet excited state having a lowest energy level T1 of 2.7 eV or more.

5. The organic electroluminescent device of claim 1, wherein the electrically inactive organic compound has an ionization potential Ip of 6.1 eV or more.

6. The organic electroluminescent device of claim 1, wherein the electrically inactive organic compound is an aromatic hydrocarbon compound.

7. The organic electroluminescent device of claim 1, wherein the electrically inactive organic compound has a molecular weight of from 300 to 2,000.

8. The organic electroluminescent device of claim 1, wherein $R_1$ and $R_3$ each independently represent a substituent selected from the group consisting of an alkyl group, an alkenyl group, an alkynyl group, an aryl group, an amino group, an alkoxy group, an aryloxy group, a heteroaryloxy group, an acyl group, an alkoxycarbonyl group, an aryloxycarbonyl group, an acyloxy group, an acylamino group, an alkoxycarbonylamino group, aryloxycarbonylamino group, a sulfonylamino group, a sulfamoyl group, a carbamoyl group, an alkylthio group, an arylthio group, a heteroarylthio group, a sulfonyl group, a sulfinyl group, an ureido group, a phosphoric amido group, a hydroxyl group, a mercapto group, a halogen atom, a cyano group, a sulfo group, a carboxyl group, a nitro group, a hydroxamic group, a sulfino group, a hydrazino group, an imino group, a heterocyclic group and a silyl group.

* * * * *